(12) United States Patent
Mashiko et al.

(10) Patent No.: US 6,364,924 B1
(45) Date of Patent: Apr. 2, 2002

(54) AIR PERMEABLE CAP AND OUTDOOR LAMP, AUTOMOBILE LAMP AND ELECTRICAL COMPONENT COMPRISING SAME

(75) Inventors: Hiroaki Mashiko; Hiroyuki Nishii; Norikane Nabata, all of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/559,648

(22) Filed: Apr. 28, 2000

(30) Foreign Application Priority Data

Nov. 18, 1999 (JP) .......................................... 11-328773

(51) Int. Cl.[7] ............................ B01D 48/00; B01D 53/22
(52) U.S. Cl. ........................ 55/385.4; 55/385.1; 55/524; 55/527; 55/DIG. 30; 96/13; 96/14
(58) Field of Search ............................... 55/385.1, 385.4, 55/524, 527, DIG. 30; 96/13, 14

(56) References Cited

U.S. PATENT DOCUMENTS

| | | | |
|---|---|---|---|
| 3,638,402 A | * | 2/1972 | Thomas ..................... 55/385.4 |
| 4,256,474 A | * | 3/1981 | Berger, Jr. et al. ......... 55/385.4 |
| 4,271,977 A | * | 6/1981 | Sajone |
| 5,914,415 A | | 6/1999 | Tago |

FOREIGN PATENT DOCUMENTS

| | | |
|---|---|---|
| JP | 41-24461 | 12/1941 |
| JP | 60-9522 | 1/1985 |
| JP | 62-35614 | 3/1987 |
| JP | 1-65619 | 4/1989 |

* cited by examiner

*Primary Examiner*—Duane Smith
*Assistant Examiner*—Minh-Chau T. Pham
(74) *Attorney, Agent, or Firm*—Sughrue Mion, PLLC

(57) ABSTRACT

The present invention provides a compact and inexpensive air-permeable cap and an outdoor lamp, automobile lamp and automobile electrical component including such an air-permeable cap. A novel air-permeable cap is provided including a closed-end cylindrical cover member, a substantially cylindrical body fitted in the closed-end cylindrical cover member, and an air passage formed between the inner wall of the closed-end cylindrical cover member and the outer wall of the substantially cylindrical body and between the bottom surface of the closed-end cylindrical cover member and the lower end of the substantially cylindrical body, wherein the mounting portion at which the air-permeable cap is mounted on the mounting opening of the housing is formed at the top of the substantially cylindrical body.

11 Claims, 6 Drawing Sheets

AIR PERMEABLE CAP AND OUTDOOR LAMP, AUTOMOBILE LAMP AND ELECTRICAL COMPONENT COMPRISING SAME

FIELD OF THE INVENTION

The present invention relates to an air-permeable cap to be mounted on a housing for automobile headlamp or the like for rendering the housing ventilative and rendering the interior of the housing waterproof and an outdoor lamp, automobile lamp and automobile electrical component comprising the air-permeable cap.

BACKGROUND OF THE INVENTION

Heretofore, an air-permeable cap has been used for housing for automobile electrical components such as automobile headlamp, rear lamp, fog lamp, turn lamp, motor, various pressure sensors, pressure switches and ECU (electronic control unit) case and devices such as portable telephone, camera, electric razor, electric toothbrush and outdoor lamp.

In some detail, the foregoing device housing can be provided with the foregoing air-permeable cap at an opening formed therein for communicating between the interior and the exterior thereof to prevent the entrance of water, dust, etc. into the interior thereof, relax the change in the pressure in the device housing due to the temperature change, allow sound to be transmitted between the interior and the exterior of the device housing or allow the release of gas produced in the device housing.

As shown in FIG. 7, a device housing 50 such as automobile electrical component which is subject to exposure to contaminants such as rainwater, muddy water and oil can be provided with an air-permeable cap which may be in the form of L-shaped cylindrical body 51 or U-shaped cylindrical body (not shown) or provided with a maze structure thereinside as shown in FIG. 8, which fits on a mounting opening 50a formed at the neck portion of the housing for mounting the air-permeable cap. In this arrangement, the foregoing contaminants can be prevented from being directly applied to the mounting opening 50a. As a result, the foregoing mounting opening 50a cannot be clogged, assuring the air permeability and waterproofness of the mounting opening 50a.

As shown in FIG. 9, in the case where further dustproofness or waterproofness is required, a filter member 54 may be stuck to the forward end of the mounting opening 50a formed at the neck portion of the device housing 50 with an annular double-coated tape 55 or the like before the foregoing cylindrical body 51 is fitted on the mounting opening 50a formed on the neck portion. In the case where the filter member 54 has an insufficient strength, the filter member 54 may be reinforced by a reinforcing material 53.

However, even if the foregoing cylindrical body 51 is fitted, water, dust or the like cannot be occasionally prevented from entering into the interior of the housing for devices such as automobile electrical component. When the length of the foregoing cylindrical body 51 is increased to make it more difficult for water, dust or the like to enter into the interior of the housing, it disadvantageously adds to the space required for the mounting of the cylindrical body 51 and the cost of the cylindrical body 51. Further, when the cylindrical body 51 is with a maze structure 52 thereinside, the cylindrical body 51 is disadvantageously complicated, adding to its cost. Moreover, when the foregoing filter member 54 is used, it is disadvantageous in that a step of mounting the filter member 54 or the like must be added before the step of fitting the cylindrical body 51.

On the other hand, the foregoing cylindrical body 51 can be easily fitted on the mounting opening 51 but can easily come off from the mounting opening 51. By increasing the thickness of the cylindrical body 51, the fitting force (pull strength) of the cylindrical body 51 with respect to the mounting opening 50a formed at the neck portion of the device housing 50 can be increased. However, when the thickness of the cylindrical body 51 is increased, it is disadvantageous in that the size of the cylindrical body 51 itself increases, adding to the space required for mounting and the cost of the cylindrical body 51.

Known besides the foregoing cylindrical body 51 is a vent filter member proposed in JP-A-10-85536 (The term "JP-A" as used herein means an "unexamined published Japanese patent application") (see FIG. 10). The vent filter member comprises a substantially closed-end cylindrical cover cap 61, a substantially cylindrical elastomer member 62 fitted in the cover cap 61 coaxially of the cover cap 61, an air passage formed between the inner wall of the cover cap 61 and the outer wall of the elastomer member 62 and between the bottom surface of the cover cap 61 and the lower end of the elastomer member 62, and a water-repellent membrane 64 covering an opening in the bottom of the elastomer member 62. The top opening of the elastomer member 62 forms a mounting portion 65 at which the vent filter member is fitted on the mounting opening 50a of the device housing 50.

Provided standing at the bottom surface of the cover cap 61 close to the inner wall of the cover cap are four fixing pins 66. Formed in the peripheral portion of the elastomer member 62 are pin holes 67 corresponding to the respective fixing pins 66. The fixing pins 66 of the cover cap 61 are inserted into the respective pin holes 67 of the elastomer member 62 in such an arrangement that the water-repellent membrane 64 is protected (the water-repellent membrane 64 and the bottom surface of the cover cap 61 are opposed to each other). The forward end of the fixing pins 66 protruding from the respective pin holes 67 are then thermally deformed. In this manner, the elastomer member 62 is positioned and fixed in the cover cap 61.

However, the vent filter member requires a complicated structure to fix the elastomer member 62 to the cover cap 61 and thus is so great in size that it can be hardly provided in a compact form and at a reduced cost. Further, in order to fixing the elastomer member 62 to the cover cap 61, it is necessary that the pin holes 67 of the elastomer member 62 be positioned at the respective fixing pins 66 of the cover cap 61, requiring much time to fix the elastomer member 62 to the cover cap 61.

SUMMARY OF THE INVENTION

It is therefore an object of the present invention to provide a compact and inexpensive air-permeable cap and an outdoor lamp, automobile lamp and automobile electrical component comprising such an air-permeable cap.

The foregoing object of the present invention will become apparent from the following detailed description and examples.

The foregoing object of the invention is accomplished with the first subject of the invention which lies in an air-permeable cap comprising a closed-end cylindrical cover member, a substantially cylindrical body fitted in the closed-end cylindrical cover member, and an air passage formed between the inner wall of the closed-end cylindrical cover member and the outer wall of the substantially cylindrical body and between the bottom surface of the closed-end cylindrical cover member and the lower end of the substantially cylindrical body, wherein the mounting portion at which the air-permeable cap is mounted on the mounting opening of the housing is formed at the top of the substantially cylindrical body. The second subject of the invention is an outdoor lamp comprising the foregoing air-permeable cap. The third subject of the invention is an automobile lamp comprising the foregoing air-permeable cap. The fourth subject of the invention is an automobile electrical component comprising the foregoing air-permeable cap.

More specifically, the foregoing object of the invention can be attained by the following means.

(1) An air-permeable cap comprising a closed-end cylindrical cover member, a substantially cylindrical body fitted in said closed-end cylindrical cover member, and an air passage formed between the inner wall of said closed-end cylindrical cover member and the outer wall of said substantially cylindrical body and between the bottom surface of said closed-end cylindrical cover member and the lower end of said substantially cylindrical body, wherein the mounting portion at which the air-permeable cap is mounted on the mounting opening of the housing is formed at the top of said substantially cylindrical body.

(2) The air-permeable cap as described in (1) above, wherein a plurality of protrusions are formed at a predetermined interval along the periphery of said substantially cylindrical body, said protrusions come in contact with the inner wall of said closed-end cylindrical cover member so that said cylindrical body is positioned and fixed and an air passage is formed between said protrusions.

(3) The air-permeable cap as described in (1) or (2) above, wherein the elastic modulus of said cover member is different from that of said substantially cylindrical body.

(4) The air-permeable cap as described in any one of (1) to (3) above, wherein said cover member and said substantially cylindrical body are fitted at two or more contact portions.

(5) The air-permeable cap as described in any one of (1) to (4) above, wherein the air permeation sectional area of said air passage is $1 \times 10^{-6}$ m$^2$ or more at all positions.

(6) The air-permeable cap as described in any one of (1) to (5) above, wherein the top opening of said cover member or the bottom opening of said substantially cylindrical body is covered by a filter member.

(7) The air-permeable cap as described in (6), wherein the air permeation sectional area of said filter member is $3 \times 10^{-6}$ m$^2$ or more.

(8) The air-permeable cap as described in (6) or (7) above, wherein said filter member is a porous membrane made of polytetrafluoroethylene.

(9) The air-permeable cap as described in any one of (6) to (8) above, wherein said filter member is rendered oil-repellent.

(10) An outdoor lamp comprising an air-permeable cap as described in any one of (1) to (9) above.

(11) An automobile lamp comprising an air-permeable cap as described in any one of (1) to (9) above.

(12) An automobile electrical component comprising an air-permeable cap as described in any one of (1) to (9) above.

The air-permeable cap of the invention comprises a substantially cylindrical body fitted in a closed-end cylindrical cover member and thus requires only a simple structure to fix the cover member and the substantially cylindrical body to each other. Accordingly, an air-permeable cap can be easily provided in a compact form and at a low cost.

Further, the outdoor lamp, automobile lamp and automobile electrical component according to the invention comprise the foregoing air-permeable cap and thus require only a reduced space to mount the air-permeable cap.

BRIEF DESCRIPTION OF THE DRAWINGS

By way of example and to make the description more clear, reference is made to the accompanying drawings in which.

DETAILED DESCRIPTION OF THE INVENTION

Embodiments of the implication of the invention will be further described in connection with the attached drawings.

Figure 1:
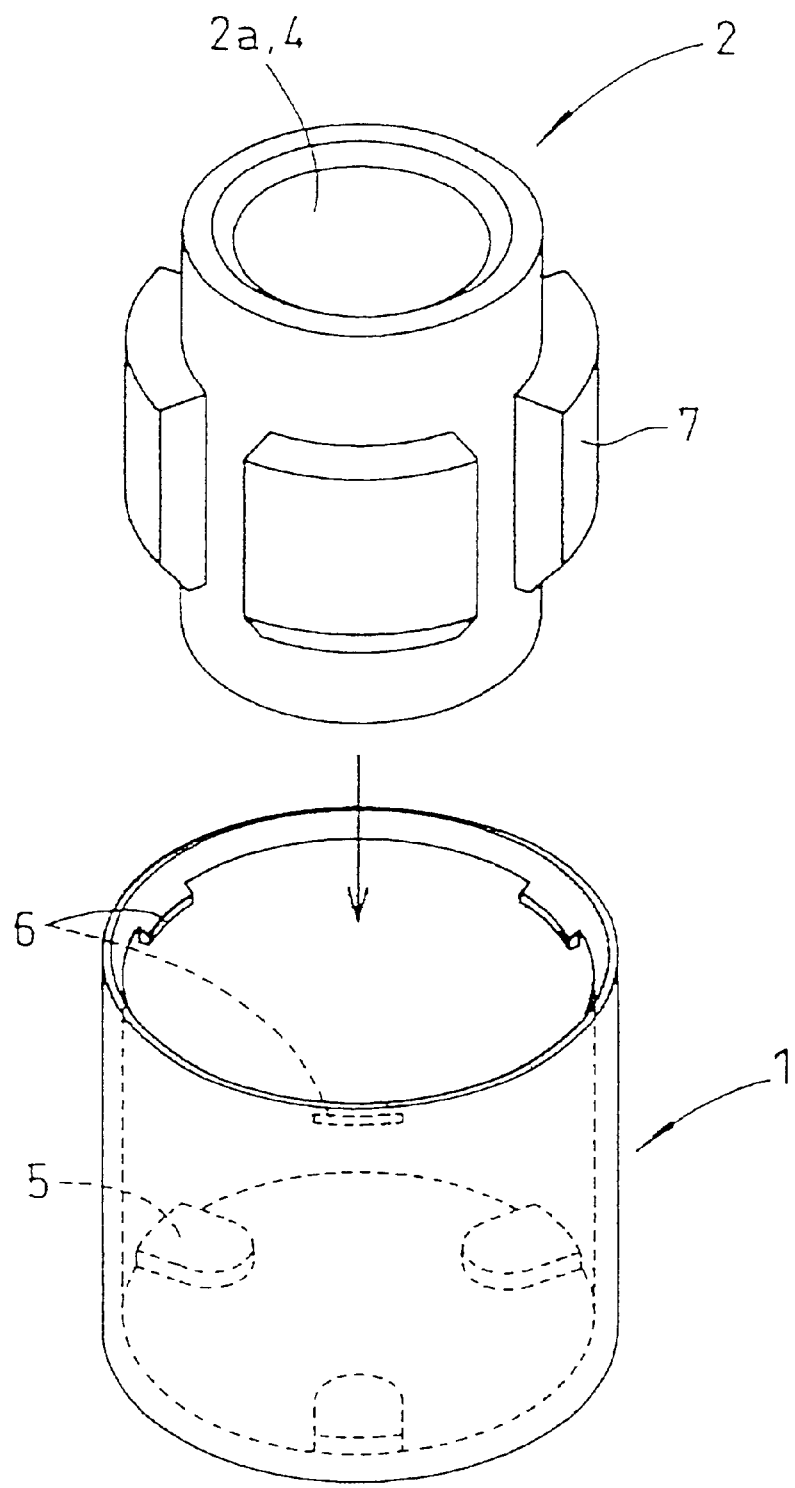
FIG. 1 is a diagram illustrating an embodiment of the air-permeable cap according to the invention.
Figure 2:
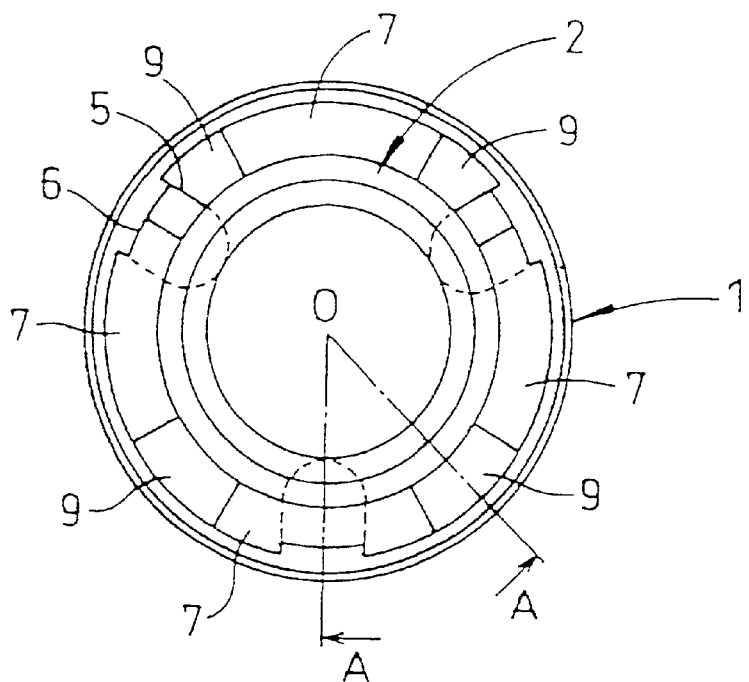
FIG. 2 is a plan view illustrating the air-permeable cap of FIG. 1.
Figure 3:
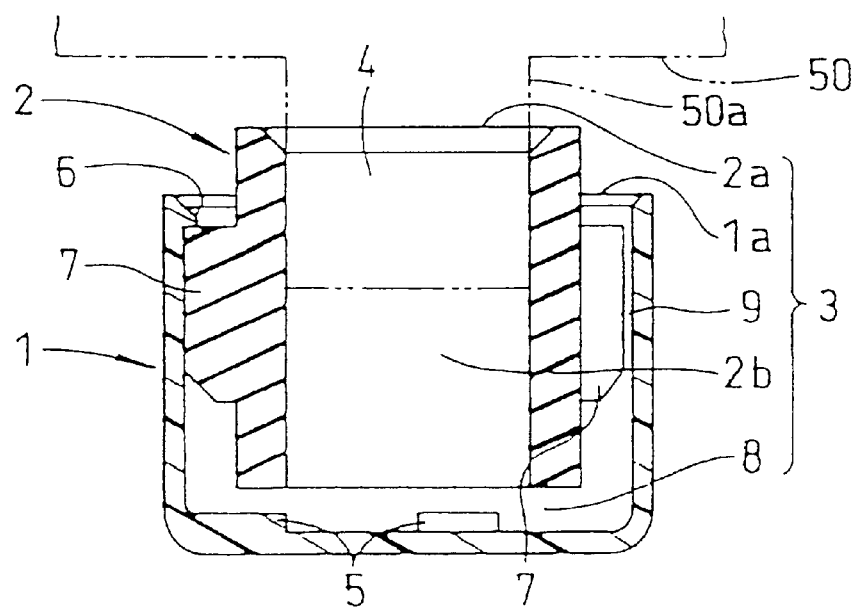
FIG. 3 is a sectional view taken on line A-O-A of FIG. 2 illustrating the air-permeable cap of FIG. 1.

FIGS. 1 to 3 are diagrams each illustrating an embodiment of the air-permeable cap according to the invention. In this embodiment, the air-permeable cap comprises a substantially cylindrical body 2 fitted in a closed-end cover member 1. An air passage 3 is formed between the inner wall of the cover member 1 and the outer wall of the substantially cylindrical body 2 and between the bottom surface of the cover member 1 and the lower end of the substantially cylindrical body 2. The top opening 2a of the substantially cylindrical body 2 protrudes from the opening of the cover member 1 and forms a mounting portion 4 at which the air-permeable cap is mounted on the mounting opening 50a of a device housing 50.

Referring further, the foregoing cover member 1 is made of a synthetic resin. Three pedestals 5 are formed equally apart from each other on the bottom surface of the cover member 1 along the inner wall of the cover member 1. Three engaging lobes 6 are formed protruding inward equally apart from each other along the inner rim of the opening 1a of the cover member 1.

The substantially cylindrical body 2 is made of an elastomer. Four protrusions 7 were formed equally apart from each other on the central part of the outer wall of the cylindrical body 2 along the periphery of the cylindrical body 2. The outer diameter of the substantially cylindrical body 2 (including the protrusions 7) is slightly greater than the inner diameter of the cover member 1.

While the substantially cylindrical body 2 is being fitted in the cover member 1, the outer surface of the protrusions 7 is pressed against the inner wall of the cover member 1 and the upper surface of the protrusions 7 engages with the respective engaging lobes 6. Under the foregoing fitting conditions, even if the substantially cylindrical body 2 is inserted into the cover member 1 down to the bottom thereof, the pedestals 5 formed on the bottom of the cover member 1 and the lower end of the substantially cylindrical body 2 come in contact with each other to form a gap 8 between the bottom of the cover member 1 and the lower end of the substantially cylindrical body 2. In this arrangement, an air passage is formed communicating from the top opening 2a of the substantially cylindrical body 2 to the opening 1a of the cover member 1 through the inner space 2b of the substantially cylindrical body 2, the gap 8 between the bottom of the cover member 1 and the lower end of the substantially cylindrical body 2 and the gap between the adjacent protrusions 7, 7. The sectional area of the air passage 3 is predetermined to $1 \times 10^{-6}$ m$^2$ or more at all positions.

By fitting the mounting portion 4 (top opening 2a) of the substantially cylindrical body 2 on the mounting opening 50a formed on the neck portion of the device housing 50, the air-permeable cap can be mounted on the device housing 50. Once the air-permeable cap has been mounted on the device housing 50, the device housing 50 is vented to communicate between the interior and the exterior thereof through the air passage 3 of the air-permeable cap. The cover member 1 of the air-permeable cap renders the interior of the device housing 50 waterproof.

Thus, in accordance with the foregoing embodiment of implication of the invention, by merely fitting the substantially cylindrical body 2 in the closed-end cylindrical cover member 1, the substantially cylindrical body 2 can be positioned and fixed in the cover member 1, making it possible to simplify the structure for fixing the cover member 1 and the substantially cylindrical body 2 to each other. As a result, the air-permeable cap can be provided in a compact form and at a reduced cost.

Further, since the foregoing air-permeable cap can be provided in a compact form, the housing 50 for devices such as outdoor lamp, automobile lamp and automobile electrical component comprising the air-permeable cap requires a reduced space for mounting the air-permeable cap.

Moreover, since the cover member 1 is made of a synthetic resin and the substantially cylindrical body 2 is made of an elastomer so that the two components have different elastic moduli, the cover member 1 and the substantially cylindrical body 2 can be fixed to each other more firmly. This is because when it is tried to pull the substantially cylindrical body 2 from the cover member 1 to which it has been fitted and fixed, the component having a smaller elastic modulus undergoes distortion that resists pulling. Further, from the standpoint of ease of fitting in the neck portion of the device housing 50 (mounting opening 50a), the cover member 1 preferably has a greater elastic modulus than the substantially cylindrical body 2.

Further, since the sectional area of the air passage 3 is predetermined to $1 \times 10^{-6}$ m$^2$ or more at all positions, air can pass through the passage at a small pressure loss.

Figure 4:
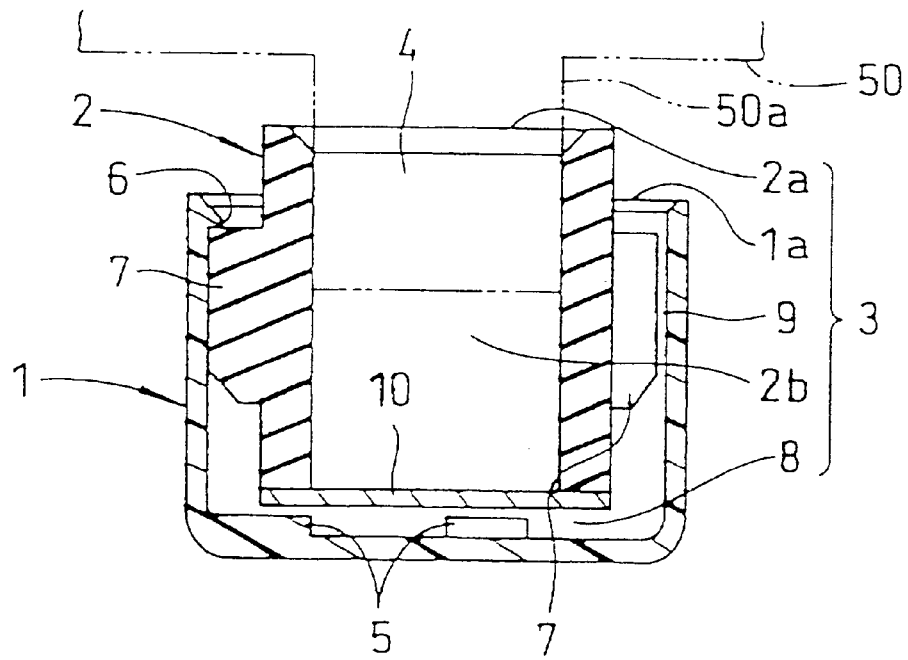
FIG. 4 is a sectional view illustrating another embodiment of the air-permeable cap according to the invention.

FIG. 4 is a diagram illustrating another embodiment of the air-permeable cap according to the invention. In accordance with this embodiment, the air-permeable cap comprises an air-permeable filter member 10 covering the bottom opening of the substantially cylindrical body 2 shown in FIGS. 1 to 3. The air permeation area of the filter member 10 is predetermined to $5 \times 10^{-6}$ m$^2$ or more. For other portions, this embodiment is the same as the foregoing embodiment. Like numerals are used for where the components are the same as those of FIGS. 1 to 3.

Thus, the air-permeable cap comprising an air passage covered by the filter member 10 can be rendered more waterproof and dustproof. Further, since the air permeation area of the filter member 10 is predetermined to $5 \times 10^{-6}$ m$^2$ or more, air can pass through the filter member 10 at a small pressure loss. Although this embodiment comprises the filter member 10, the filter member 10 is previously fixed to the air-permeable cap unlike the conventional technique shown in FIG. 9. In such an arrangement, it is not required that a step of mounting the filter member 10 on the device housing 50 be effected before the step of mounting the air-permeable cap on the device housing 50. The mounting of the filter member 10 can be accomplished by various methods such as heat fusion, ultrasonic solvent welding and bonding with an adhesive or the like.

In the case where it is required that the filter member 10 be capable enough to prevent the entrance of water spray or big dust, the filter member 10 may be made of a woven cloth, nonwoven cloth or net of fibrous material, regardless of which it is natural or synthetic, a porous material obtained by sintering a powder, a foamed material or the like. If necessary, the filter member 10 may be subjected to various treatments such as water-repellent treatment and oil-repellent treatment. A laminate of these filter members may be used.

Further, the filter member 10 may be made of a microporous membrane produced by stretching process, extraction process or the like if it needs to be highly waterproof or dustproof. The microporous membrane may be used in the form of laminate with other elements such as reinforcing material (air-permeable material such as woven cloth, nonwoven cloth and net). If necessary, the microporous membrane or its laminate may be subjected to various treatments such as water-repellent treatment and oil-repellent treatment. As the means for this water-repellent treatment or oil-repellent treatment there is known a method which comprises applying a chemical having a small surface tension to the material, and then drying the coated material. Examples of the microporous membrane which can be preferably used particularly from the standpoint of the water repellency, heat resistance and chemical resistance of the material itself include porous polytetrafluoroethylene membrane and various laminates thereof. The microporous membrane to be used herein preferably has pores having a diameter of from 0.01 to 10 $\mu$m.

Figure 5:
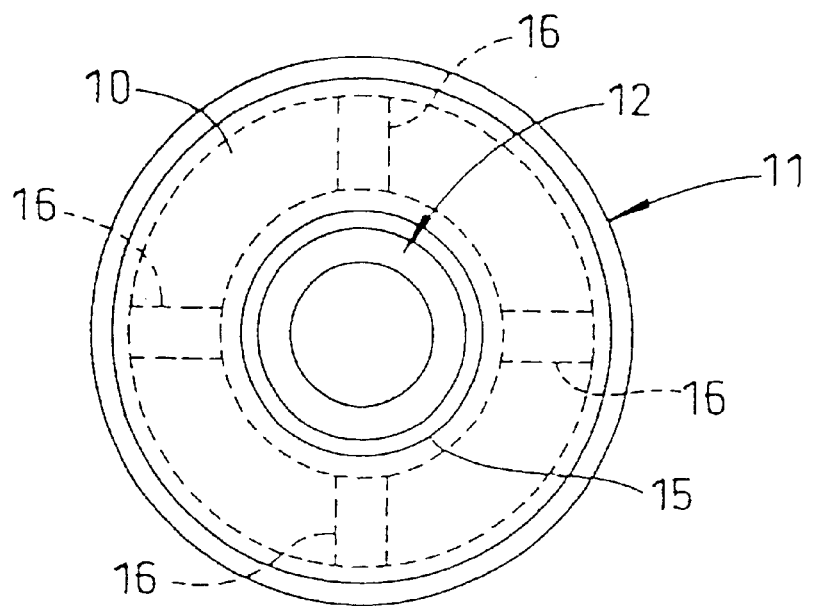
FIG. 5 is a sectional view illustrating a further embodiment of the air-permeable cap according to the invention.
Figure 6:
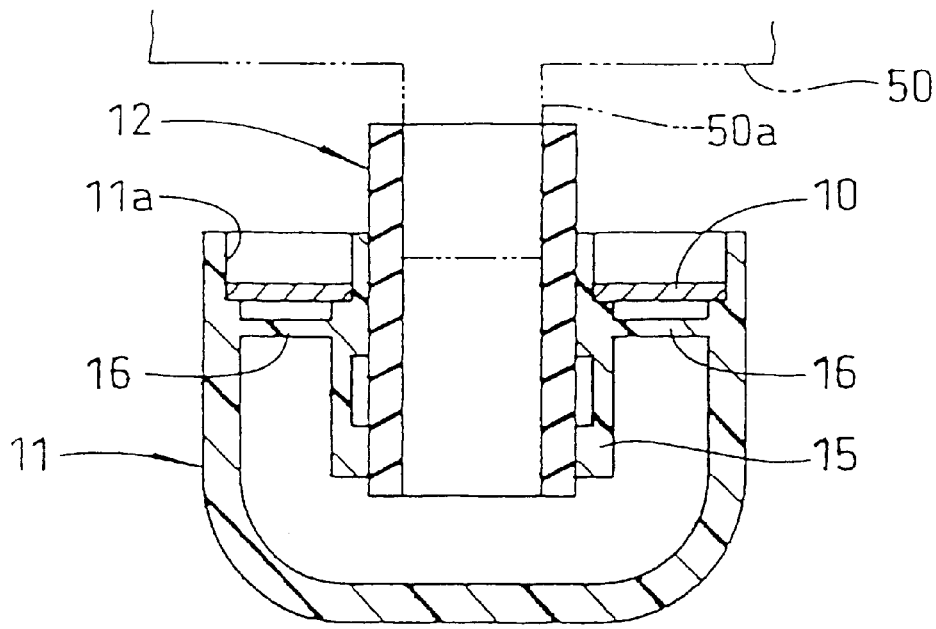
FIG. 6 is a sectional view illustrating the air-permeable cap of FIG. 5.

FIGS. 5 and 6 are diagrams illustrating a further embodiment of the air-permeable cap according to the invention. In accordance with this embodiment, the cover member 11 has a double cylinder structure comprising an inner cylindrical portion 15 fixed in a closed-end cylindrical cover member 11. The substantially cylindrical body 12 is fitted in the inner cylindrical portion 15. The opening 11a between the inner wall of the cover member 11 and the outer wall of the inner cylindrical portion 15 is covered by a filter member 10 similar to that described above. The air permeation area of the filter member 10 is predetermined to $3 \times 10^{-6}$ m$^2$ or more, preferably from $3 \times 10^{-6}$ m$^2$ to $3 \times 10^{-2}$ m$^2$. Referring to other portions, this embodiment is the same as the foregoing embodiments.

Referring further, the inner cylindrical portion 15 of the cover member 11 is supported by four supports 16 formed equally apart from each other along the periphery of the inner cylindrical portion 15 between the inner wall of the cover member 11 and the outer wall of the inner cylindrical portion 15. A gap is formed between the lower end of the inner cylindrical portion 15 and the bottom of the cover member 11.

The substantially cylindrical body 12 is cylindrical and is fitted in the inner cylindrical portion 15 in such an arrangement that the lower end thereof does not come in contact with the bottom of the cover member 11.

The air-permeable cap having such an arrangement can exert the same effect as exerted by the foregoing embodiments.

When used for purposes requiring waterproofness, dust-proofness and air permeability as an air-permeable cap for an outdoor lamp, automobile lamp, automobile electrical component or the like, the air-permeable cap according to the various embodiments of implication of the invention can sufficiently perform. In the case where the air-permeable cap having a filter member 10 fixed thereto is mounted on an automobile lamp or the like, when air in the automobile lamp or the like is cooled due to the temperature drop, dew condensation may take place. However, when the temperature rises again, dew becomes water vapor that then passes through the filter member 10 to the exterior of the automobile lamp or the like.

In the various embodiments of implication of the invention, the cover members 1, 11 are made of a synthetic resin and the substantially cylindrical bodies 2, 12 are made of an elastomer. However, the present invention is not limited to these materials These components may be made of other materials. For example, the cover members 1, 11 may be made of an elastomer and the substantially cylindrical bodies 2, 12 may be made of a synthetic resin. Alternatively, both the cover members 1, 11 and substantially cylindrical bodies 2, 12 may be made of a synthetic resin or elastomer. In this case, it is preferred that the elastic modulus of the cover members 1, 11 is different from that of the substantially cylindrical bodies 2, 12. As previously mentioned, the elastic modulus of the cover members 1, 11 is preferably greater than that of the substantially cylindrical bodies 2, 12. As the material having a greater elastic modulus than the other there is preferably used a polypropylene, high density polyethylene or the like. As the material having a smaller elastic modulus than the former material there is preferably used an elastomer, rubber, low density polyethylene or the like.

In the various embodiments of implication of the invention, the air permeation sectional area of the air passage 3 is predetermined to $1\times10^{-6}$ $m^2$ or more at all positions. This is because when the air permeation sectional area falls below $1\times10^{-6}$ $m^2$, air passes through the air passage 3 at an extremely great pressure loss. Preferably, the air permeation sectional area is predetermined to a range of from $1\times10^{-6}$ $m^2$ to $1\times10^{-2}$ $m^2$.

The present invention will be further described in the following examples and comparative examples.

EXAMPLE 1

The cover member 1 and substantially cylindrical body 2 shown in FIGS. 1 to 3 were each prepared by subjecting a Type J110K high density polyethylene resin produced by Chisso Corporation (flexural modulus: $9.8\times10^8$ $N/m^2$) and Milastomer 6030 produced by Mitsui Chemical Corporation (thermoplastic elastomer; flexural modulus: $4.41\times10^8$ $N/m^2$) to injection molding, respectively. The cover member 1 thus obtained has an outer diameter of 17.5 mm and an inner diameter of 15.5 mm. The substantially cylindrical body 2 thus obtained had an outer diameter of 160 mm at maximum, an inner diameter of 7.5 mm at the mounting portion 4 (top opening 2a) and a thickness of 2 mm. The substantially cylindrical body 2 was then fitted in the cover member 1 to obtain an air-permeable cap according to the invention. The air-permeable cap had a height of 14.5 mm at maximum (distance between the lower end of the cover member 1 and the top of the substantially cylindrical body 2). The foregoing flexural modulus was measured and calculated according to ASTM D 790.

The air-permeable cap thus obtained was then measured for fitting force and pulling force and subjected to shower test in accordance with the following methods. As a result, the air-permeable cap thus obtained exhibited a fitting force of 29.4 N and a pulling force of 19.6 N. At the shower test, no water entered into the air-permeable cap.

[Fitting Force]

Using a tensile testing machine, the cover member 1 and the substantially cylindrical body 2 are pulled from each other in the direction opposite the fitting direction at a pulling rate of 50 mm/min. The maximum tensile strength is defined to be fitting force.

[Pulling Force]

Figure 7:
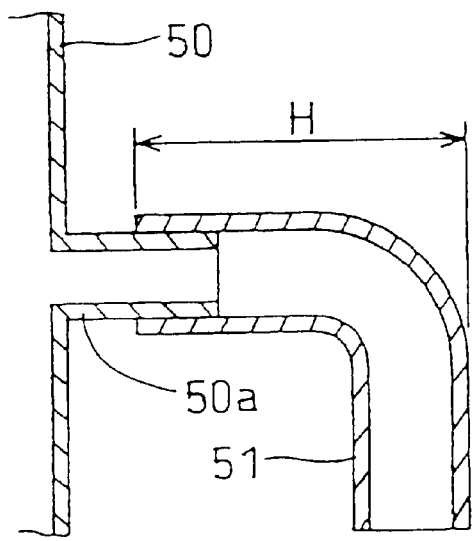
FIG. 7 is a sectional view illustrating a conventional air-permeable cap.
Figure 8:
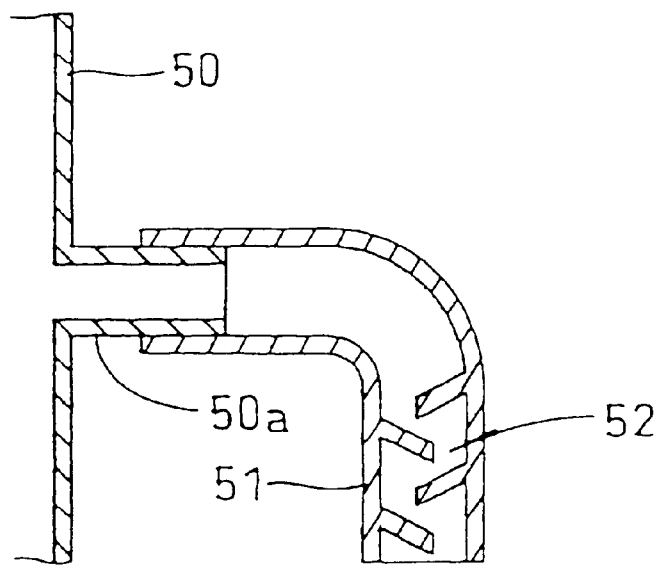
FIG. 8 is a sectional view illustrating another conventional air-permeable cap.

Into the mounting portion 4 (top opening 2a) of the substantially cylindrical body 2 or the fitting opening of the cylindrical body 51 shown in FIG. 7 or the like is inserted a columnar rod of polypropylene having an outer diameter of 20% greater than the inner diameter of the mounting portion 4 of the substantially cylindrical body 2 or the fitting opening of the cylindrical body 51 to a depth of 8 mm. Using a tensile testing machine, the substantially cylindrical body 2 or the cylindrical body 51 is then pulled from the rod in the pulling direction at a pulling rate of 50 mm/min. The maximum tensile strength is defined to be pulling force.

[Shower Test]

Into the mounting portion 4 (top opening 2a) of the substantially cylindrical body 2 of the air-permeable cap or the fitting opening of the cylindrical body 51 shown in FIG. 7 or the like is inserted a cylindrical rod of polypropylene having an outer diameter of 20% greater than the inner diameter of the mounting portion 4 of the substantially cylindrical body 2 or the fitting opening of the cylindrical body 51 to a depth of 8 mm. The air-permeable cap is placed so that the longitudinal axis of the cylindrical rod is horizontal, and the air-permeable cap is entirely sprayed with shower water at a rate of 1 1/min at a hydraulic pressure of 0.1 MPa. The cylindrical rod is then examined for entrance of water.

EXAMPLE 2

The cover member 1 and the substantially cylindrical body 2 shown in FIG. 4 were prepared by subjecting a Type J815HK UBE Polypropylene produced by Ube Industries, Ltd. (flexural modulus: $1.47\times10^9$ $N/m^2$) and Milastomer 6030 produced by Mitsui Chemical Corporation (thermoplastic elastomer; flexural modulus: $4.41\times10^8$ $N/m^2$) to injection molding, respectively. Separately, as the filter member 10 shown in FIG. 4 there was prepared Microtex NTF1026-K02 produced by Nitto Denko Corporation (laminate of a porous membrane of polytetrafluoroethylene having a thickness of 25 $\mu$m, an average pore diameter of 0.6 $\mu$m and a porosity of 85% and a nonwoven fabric (ELEVES produced by Unitika Ltd.) having a thickness of about 130

μm). Subsequently, the filter member 10 was placed on the lower end of the substantially cylindrical body 2 in such an arrangement that the nonwoven polyolefin fabric side of the filter member 10 came in contact with the bottom of the substantially cylindrical body 2. The laminate was then pressed from the porous membrane side of polytetrafluoroethylene at a temperature of 150° C. and a pressure of $9.8 \times 10^4$ Pa for 10 seconds to cause heat fusion. Thereafter, a hydraulic pressure of $9.8 \times 10^4$ Pa was applied to the filter member 10 from the top side thereof to see that the filter member 10 did not leak water. The size of the cover member 1, substantially cylindrical body 2 and the like thus obtained were the same as in Example 1.

The air-permeable cap thus obtained was then measured for fitting force and pulling force and subjected to shower test in accordance with the foregoing methods. As a result, the air-permeable cap thus obtained exhibited a fitting force of 34.3 N and a pulling force of 19.6 N. At the shower test, no water entered into the air-permeable cap.

EXAMPLE 3

The filter member 10 of Example 2 was subjected to water-repellent treatment and oil-repellent treatment. In some detail, a copolymer comprising 40 mol % of an alkyl methacrylate and 60 mol % of a perfluoroalkyl methacrylate and a solvent obtained by uniformly mixing 100 parts by weight of toluene, 39 parts by weight of n-heptane and 3.5 parts by weight of methyl acetate were prepared. Subsequently, the foregoing copolymer was dissolved in the solvent to prepare a water-repellent and oil-repellent agent solution having a solid content of 5% by weight. The water-repellent and oil-repellent agent solution thus prepared was applied to the filter member 10, and then dried at a temperature of 150° C. for 3 minutes. In this manner, the filter member 10 was subjected to water-repellent treatment and oil-repellent treatment. The other conditions were the same as in Example 2.

The air-permeable cap thus obtained was then measured for fitting force and pulling force and subjected to shower test in accordance with the foregoing methods. As a result, the air-permeable cap thus obtained exhibited a fitting force of 34.3 N and a pulling force of 19.6 N. At the shower test, no water entered into the air-permeable cap.

COMPARATIVE EXAMPLE 1

Figure 9:
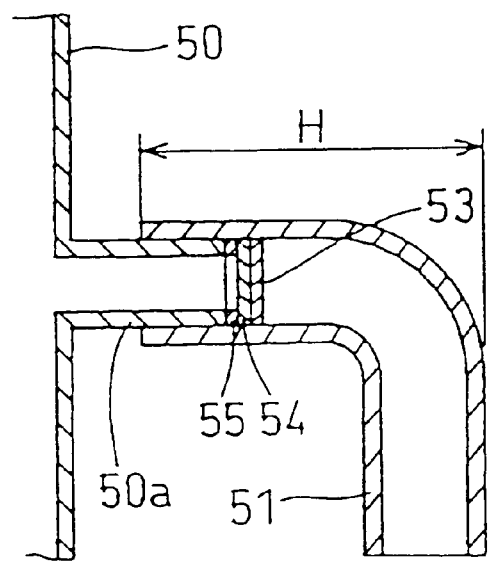
FIG. 9 is a sectional view illustrating a further conventional air-permeable cap.
Figure 10:
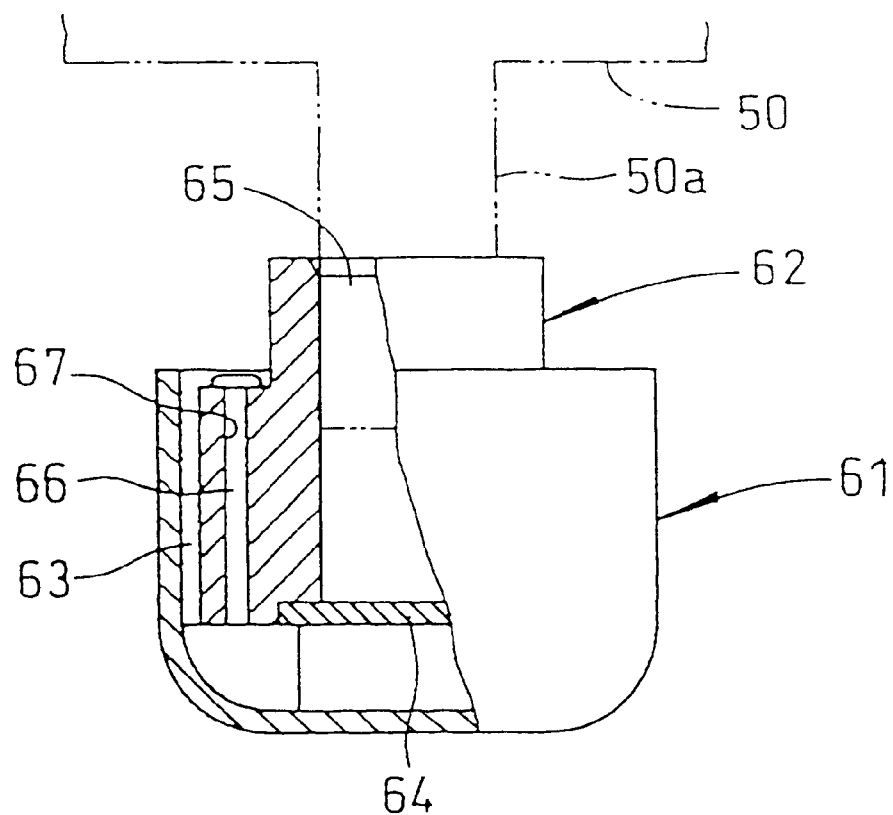
FIG. 10 is a sectional view illustrating a still further conventional air-permeable cap, wherein the reference numeral 1 indicates a cover member, the reference numeral 2 indicates a substantially cylindrical body, the reference numeral 2a indicates a top opening, the reference numeral 3 indicates an air passage, the reference numeral 4 indicates a mounting portion, the reference numeral 50 indicates a device housing, and the reference numeral 50a indicates a mounting opening.

The cylindrical body (air-permeable cap) 51 shown in FIG. 9 was prepared by subjecting a material comprising a styrene-butadiene rubber as a main component to molding and heat curing. The cylindrical body 51 thus obtained had an inner diameter of 7.5 mm, a thickness of 1 mm and a height H of 40 mm. As the filter member 54 shown in FIG. 9 there was prepared the same material as used in Example 2. The filter member 54 was then contact-bonded to the end of the opening at the neck portion of the device housing at which the cylindrical body 51 is fitted with a double-coated tape 55 in such an arrangement that the nonwoven polyolefin fabric side of the filter member 54 faced outward. Thereafter, when a hydraulic pressure of $9.8 \times 10^4$ Pa was applied to the filter member from the interior of the neck portion at which the cylindrical body 51 is fitted, some water was observed to have leaked through the gap between the double-coated tape and the end of the opening.

The air-permeable cap thus obtained was then measured for pulling force and subjected to shower test in accordance with the foregoing methods. As a result, the air-permeable cap thus obtained exhibited a pulling force of 7.84 N. At the shower test, no water entered into the air-permeable cap. For the shower test, the filter member 54 was similarly contact-bonded to the end of the opening of the cylindrical rod used for this test.

COMPARATIVE EXAMPLE 2

The cylindrical body (air-permeable cap) 51 shown in FIG. 7 was prepared by subjecting a material comprising a styrene-butadiene rubber as a main component to molding and heat curing. The cylindrical body 51 thus obtained had an inner diameter of 7.5 mm, a thickness of 2 mm and a height H of 40 mm.

The air-permeable cap thus obtained was then measured for pulling force and subjected to shower test in accordance with the foregoing methods. As a result, the air-permeable cap thus obtained exhibited a pulling force of 19.6 N. At the shower test, no water entered into the air-permeable cap.

COMPARATIVE EXAMPLE 3

The cylindrical body (air-permeable cap) 51 shown in FIG. 7 was prepared from Milastomer 6030 (thermoplastic elastomer produced by Mitsui Chemical Corporation). The cylindrical body 51 thus obtained had an inner diameter of 7.5 mm, a thickness of 1 mm and a height H of 15 mm.

The air-permeable cap thus obtained was then measured for pulling force and subjected to shower test in accordance with the foregoing methods. As a result, the air-permeable cap thus obtained exhibited a pulling force of 7.84 N. At the shower test, no water entered into the air-permeable cap.

As mentioned above, the air-permeable cap according to the invention comprises a substantially cylindrical body fitted in a closed-end cylindrical cover member and thus requires only a simplified structure for fixing the cover member to the substantially cylindrical body. Accordingly, the air-permeable cap of the invention can be provided in a compact form and at a reduced cost.

Further, the outdoor lamp, automobile lamp and automobile electrical component according to the invention comprise the foregoing air-permeable cap and thus require only a reduced space for mounting the air-permeable cap.

While the invention has been described in detail and with reference to specific embodiments thereof, it will be apparent to one skilled in the art that various changes and modifications can be made therein without departing from the spirit and scope thereof.

What is claimed is:

1. An air-permeable cap comprising a closed-end cylindrical cover member, a substantially cylindrical body fitted in said closed-end cylindrical cover member, and an air passage formed between the inner wall of said closed-end cylindrical cover member and the outer wall of said substantially cylindrical body and between the bottom surface of said closed-end cylindrical cover member and the lower end of said substantially cylindrical body, wherein the mounting portion at which the air-permeable cap is mounted on the mounting opening of the housing is formed at the top of said substantially cylindrical body, and a plurality of protrusions are formed at a predetermined interval along the periphery of said substantially cylindrical body, said protrusions come in contact with the inner wall of said closed-end cylindrical cover member so that said cylindrical body is positioned and fixed and an air passage is formed between said protrusions.

2. The air-permeable cap according to claim 1, wherein the elastic modulus of said cover member is different from that of said substantially cylindrical body.

3. The air-permeable cap according to claim 1, wherein said cover member and said substantially cylindrical body are fitted at two or more contact portions.

4. An air-permeable cap comprising a closed-end cylindrical cover member, a substantially cylindrical body fitted in said closed-end cylindrical cover member, and an air passage formed between the inner wall of said closed-end cylindrical cover member and the outer wall of said substantially cylindrical body and between the bottom surface of said closed-end cylindrical cover member and the lower end of said substantially cylindrical body, wherein the mounting portion at which the air-permeable cap is mounted on the mounting opening of the housing is formed at the top of said substantially cylindrical body, and the air permeation sectional area of said air passage is $1 \times 10^{-6}$ m$^2$ or more at all positions.

5. The air-permeable cap according to claim 1, wherein the top opening of said cover member or the bottom opening of said substantially cylindrical body is covered by a filter member.

6. An air-permeable cap comprising a closed-end cylindrical cover member, a substantially cylindrical body fitted in said closed-end cylindrical cover member, and an air passage formed between the inner wall of said closed-end cylindrical cover member and the outer wall of said substantially cylindrical body and between the bottom surface of said closed-end cylindrical cover member and the lower end of said substantially cylindrical body, wherein the mounting portion at which the air-permeable cap is mounted on the mounting opening of the housing is formed at the top of said substantially cylindrical body, and the top opening of said cover member or the bottom opening of said substantially cylindrical body is covered by a filter member, and the air permeation sectional area of said filter member is $3 \times 10^{-6}$ m$^2$ or more.

7. The air-permeable cap according to claim 5, wherein said filter member is a porous membrane made of polytetrafluoroethylene.

8. The air-permeable cap according to claim 5, wherein said filter member is rendered oil-repellent.

9. An outdoor lamp comprising an air-permeable cap according to claim 1.

10. An automobile lamp comprising an air-permeable cap according to claim 1.

11. An automobile electrical component comprising an air-permeable cap according to claim 1.

* * * * *